United States Patent [19]

Runas

[11] Patent Number: 5,570,320
[45] Date of Patent: Oct. 29, 1996

[54] DUAL BANK MEMORY SYSTEM WITH OUTPUT MULTIPLEXING AND METHODS USING THE SAME

[75] Inventor: Michael E. Runas, McKinney, Tex.

[73] Assignee: Cirrus Logic, Inc., Fremont, Calif.

[21] Appl. No.: 554,297

[22] Filed: Nov. 6, 1995

Related U.S. Application Data

[62] Division of Ser. No. 291,093, Aug. 16, 1994, Pat. No. 5,506,810.

[51] Int. Cl.$^6$ ......................................... G11C 8/00
[52] U.S. Cl. ............................. 365/230.03; 365/230.02; 365/184.02
[58] Field of Search .................... 365/230.03, 230.02, 365/230.04, 189.02, 189.04, 189.05, 238.5

[56] References Cited

U.S. PATENT DOCUMENTS

| | | | |
|---|---|---|---|
| 4,569,036 | 2/1986 | Fujii et al. | 365/230 |
| 4,773,048 | 9/1988 | Kai | 365/230 |
| 4,847,809 | 7/1989 | Suzuki | 365/189.04 |
| 4,849,937 | 7/1989 | Yoshimoto | 365/189.05 |
| 4,984,217 | 1/1991 | Sato | 365/230.02 |
| 5,036,494 | 7/1991 | Wise et al. | 365/230.03 |
| 5,146,430 | 9/1992 | Torimaru et al. | 365/222 |
| 5,245,572 | 9/1993 | Kosonocky et al. | 365/189.02 |
| 5,261,064 | 11/1993 | Wyland | 365/189.04 |
| 5,287,485 | 2/1994 | Umina et al. | 395/425 |
| 5,390,139 | 2/1995 | Smith et al. | 365/49 |

*Primary Examiner*—Tan T. Nguyen
*Attorney, Agent, or Firm*—Winstead Sechreast & Minick, P.C.

[57] ABSTRACT

A memory circuit 300 is provided which includes first and second banks 201a and 201b of memory cells arranged in rows and columns. Row decoder circuitry 210 is provided for selecting a row in at least one of the banks in response to row address. Row address circuitry 208, 209 is included for providing a sequence of row addresses to the row decoder circuitry in response to a single row address received at an address port to memory circuitry 300. Column decoder circuitry 213 is provided for selecting columns in each of the banks 201 in response to a column address. Column address circuitry 211, 212 is provided for presenting a sequence of column addresses to the column decoder circuitry in response to a single column address received at the address port.

16 Claims, 4 Drawing Sheets

DUAL BANK MEMORY SYSTEM WITH OUTPUT MULTIPLEXING AND METHODS USING THE SAME

CROSS-REFERENCE TO RELATED APPLICATIONS

This application is a divisional application of the U.S. application Ser. No. 08/291,093, filed Aug. 16, 1994 and entitled "A DUAL BANK MEMORY AND SYSTEMS USING THE SAME", now U.S. Pat. No. 5,506,810.

TECHNICAL FIELD OF THE INVENTION

The present invention relates in general to electronic devices, circuitry and systems and in particular to a dual memory and systems using the same.

CROSS-REFERENCE TO RELATED APPLICATIONS

The following copending and coassigned United States patent applications contain related material and are incorporated herein by reference:

U.S. patent application Ser. No. 08/291/155, Attorney Docket No. C3341-P03US, entitled "Circuits and Methods For Refreshing a Dual Bank Memory," and filed concurrently herewith.

BACKGROUND OF THE INVENTION

Many processing systems, such as numerical and video/graphics data processing systems, operate on sequences or streams of digital data words. For example, a typical graphics/video processing system processes sequences of pixel data words each of which defines the color or gray scale level of a corresponding pixel of a frame of pixels being displayed on a display screen. Normally, the words of pixel data defining a given frame are exchanged between the display controller, the frame buffer memory and the display in the same sequence such words will be required during the refresh of the corresponding pixels on the display screen. In numerical data processing applications, sequences of words of data may be generated, stored in memory and then sequentially retrieved when needed to perform a series of numerical calculations. In each case, it becomes critical that the time required to exchange such sequences of data between the processors and memory be minimized in order to optimize system performance.

Dynamic random access memory devices (DRAMs) are often used in the construction of sequentially accessed memory systems such as those discussed above. These devices typically store bits of data in dynamic storage cells arranged in an array of rows and columns. With this arrangement, the bits composing entire words of data can be stored in and retrieved from adjacent cells in the array—namely in adjacent cells along the same row. Page mode (burst mode) accessing is then typically used to access one or more words from a given row during a single address cycle to improve processing speed. During a DRAM page mode access (either a read or a write), a row address is presented to the device address port and latched in with a row address strobe (RAS) to select a given row in the array. A column address strobe is next presented to the address port and latched in with a column address strobe (CAS) to select a first column thereby allowing access to a first cell (bit) along the selected row. Column decode circuitry (static or dynamic) then increments from the received column address to generate a sequence of column addresses to adjacent columns, thereby allowing access to a sequence or "page" of cells (bits from the selected row.

The page (burst) length of currently available DRAMs operating the page (burst) mode is partly limited by the available column address space. In other words, the number of bits which can be accessed as a single page is dependent on the number of column addresses which can be generated during a given address cycle. Once the column address space has been exhausted, a complete new address cycle must be initiated, including precharging, the presentation and latching-in of a row address and the presentation and latching-in of a new initial column address. With each new address cycle an access time penalty is paid.

Thus, the need has arisen for improved memory architectures and circuits and systems using the same. In particular, such architectures, circuits and systems should provide for the high speed access of bursts or pages of data in processing applications requiring the sequential storage and retrieval of data.

SUMMARY OF THE INVENTION

According to a first embodiment of the present invention, memory circuitry is provided which includes first and second banks of memory cells arranged in rows and columns. Row decoder circuitry is included for selecting a row in at least one of the banks in response to a row address. Row address circuitry presents a sequence of row addresses to the row decoder circuitry in response to a single row address received at an address port to the memory circuitry. Column decoder circuitry is included for selecting a column in each of the banks in response to a column address. Finally, column address circuitry is provided for presenting a sequence of column addresses to the column decoder circuitry in response to a single column address received at the address port to the memory circuitry.

According to another embodiment of the present invention, first and second banks of memory cells are provided arranged in rows and columns, each row associated with a wordline conductor and each column associated with a bitline conductor. A first wordline decoder is coupled to the wordlines of the first bank and is operable to select a given one of the wordlines in response to a row address belonging to a first group of row addresses. A first column decoder is coupled to the bitlines of they first bank as operable to select a said bitline in response to a column address. A second wordline decoder is coupled to the wordlines of the second bank and is operable to select a given one of the wordlines of the second bank in response to a row address belonging to a second group of row addresses. A second column decoder is coupled to bitlines of the second bank as operable to select a bitline in the second bank in response to a column address. A column address counter is selectively coupled to the column address decoders and is operable to provide a sequence of column addresses to the column address decoders per each row address by incrementing from a first column address to a last column address in response to a clock signal. Finally, a row address counter is coupled to the row decoders and is operable to provide a sequence of row addresses to the row decoders by incrementing from a first row address to a last row address following access to a cell in the column corresponding to the last column address provided for the current row.

According to another embodiment of the present invention, memory circuitry is provided which includes first and second banks of memory cells arranged in rows and columns. A first row decoder is provided for selecting a row in the first bank in response to a row address from a first group of row addresses. A second row decoder is provided for selecting a row in the second bank in response to a row address from a second group of row addresses. Row address circuitry is provided for presenting a sequence of row addresses of the first and second groups to the first and second row decoders in response to a single row address provided at an address port to the memory circuitry. Column decoder circuitry is provided for selecting a column in at least one of the banks in response to a column address. Column address circuitry is included for presenting a sequence of such column addresses to the column decoder circuitry in response to a single column address received at the address port. Finally, input/output circuitry is provided for coupling a data input/output port of the memory with the first column decoder in response to row addresses of the first group from the row address circuitry and with the second column decoder in response to row addresses of the second group from the row address circuitry.

Memory circuits and systems embodying the principles of the present invention have substantial advantages over the prior art. In particular, such circuits and systems provide for the high speed access of bursts or pages of data in processing applications requiring the sequential storage and retrieval of data. Among other things, the principles of the present invention allow for the access (either read or write) to entire blocks of memory with a single row address and a single column address. The principles of the present invention advantageously eliminate the need for the generation and processing of multiple RAS cycles during a single page mode access.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–3B of the drawings, in which like numbers designate like parts.

The principles of the present invention will be illustrated within the context of a graphics/video processing system; however, memory architectures, circuits and systems according to these principles may be employed in any one of a number of processing applications, especially in those which operate on sequences of data.

Figure 1:
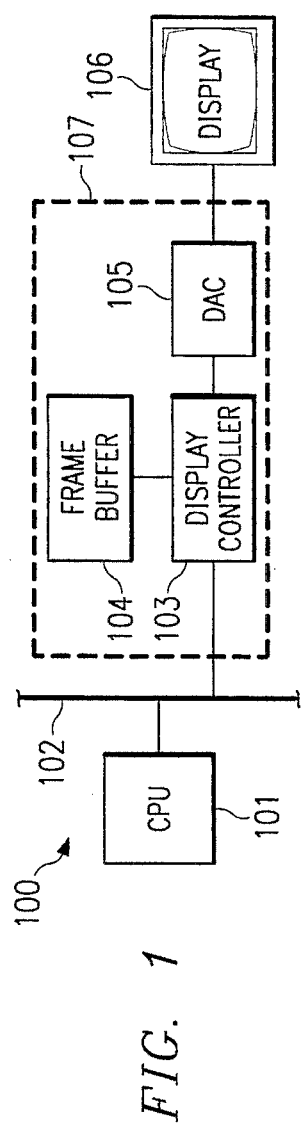
FIG. 1 is a functional block diagram of a typical system employing page made memory accesses, namely a graphics/video processing system.

FIG. 1 is a high level functional block diagram of the portion of a processing system 100 controlling the display of graphics and/or video data. System 100 includes a central processing unit 101, a system bus 102, a display controller 103, a frame buffer 104, a digital to analog converter (DAC) 105 and a display device 106. Display controller 103, frame buffer 104 and DAC 105 may fabricated together on a single integrated circuit chip 107 or on separate chips.

CPU 101 controls the overall operation of system ("master") 100, determines the content of graphics data to be displayed on display unit 106 under user commands, and performs various data processing functions. CPU 101 may be for example a general purpose microprocessor used in commercial personal computers. CPU 101 communicates with the remainder of system 100 via system bus 102, which may be for example a local bus, an ISA bus or a PCI bus. DAC 105 receives digital data from controller 103 and outputs in response the analog data required to drive display 106. Depending on the specific implementation of system 100, DAC 105 may also include a color palette, YUV to RGB format conversion circuitry, and/or x- and y-zooming circuitry, to name a few options.

Display 106 may be for example a CRT unit or liquid crystal display, electroluminescent display (ELD), plasma display (PLD), or other type of display device displays images on a display screen as a plurality of pixels. Further, display 106 may be a state-of-the-art device such as a digital micromirror device or a silicon carbide like device (as described in the January 1994 issue of the IEEE Spectrum) which directly accepts digital data. It should also be noted that in alternate embodiments, "display" 106 may be another type of output device such as a laser printer or similar document view/print appliances.

Figure 2B:
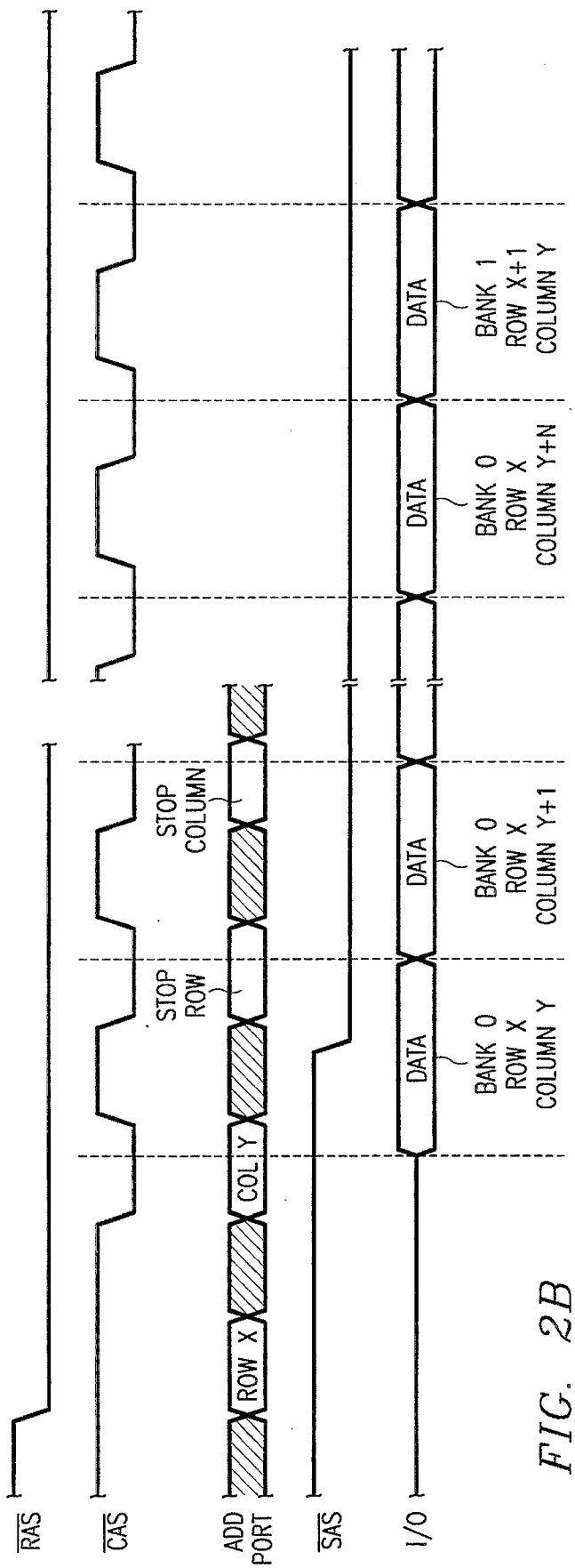
FIG. 2B is a timing diagram illustrating the timing relationship between selected signals during the operation of the memory of FIG. 2A.
Figure 2A:
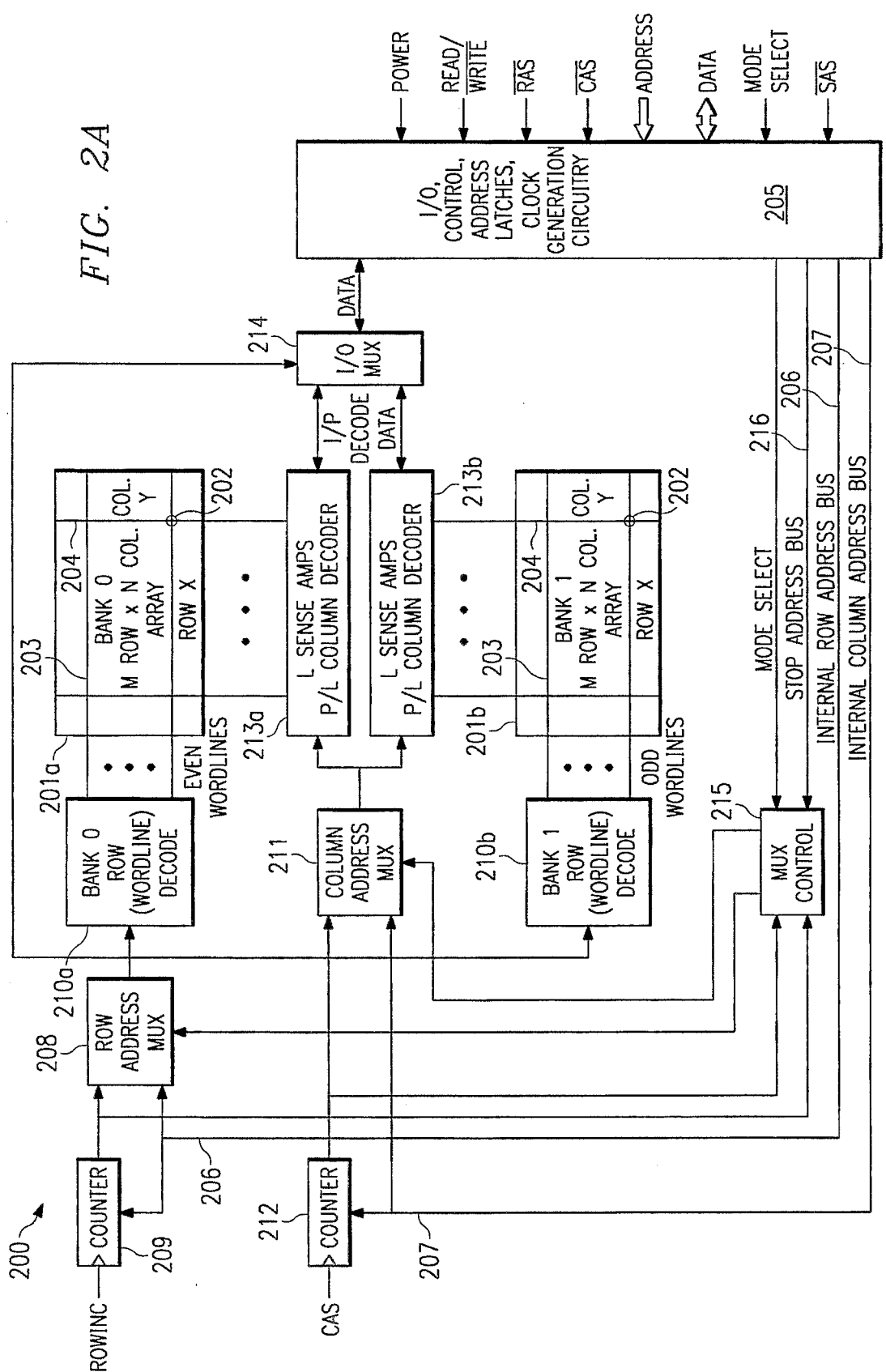
FIG. 2A is a functional block diagram of a dual bank memory embodying the principles of the present invention.

FIG. 2 is a functional block diagram of a dynamic random access memory (DRAM) 200 according to the principles of the present invention. In the system illustrated in FIG. 1, DRAM 200 is used to construct frame buffer 104, however, it should be recognized that DRAM 200 is suitable for wide range of applications, in particular any applications requiring sequential or page (burst) mode accesses. DRAM 200 includes a pair of data banks 201a (Bank 0) and 201b each comprised of a plurality of storage cells 202 arranged in an array of M number of rows and N number of columns. Each row of storage cells 202 is associated with a conductive row line (wordline) 203 and each column of cells is associated with a conductive column line (bitline) 204. A selected cell 202, wordline 203 and bitline 204 is depicted for each bank 201 for reference.

Control circuitry 205 controls the input and latching of addresses, the exchange of data with circuits and devices external to memory 200, power input and distribution, the input of control signals such as RAS, CAS, SAS, and read/write, and the generation of the required internal clocks. Upon receipt at the address port and latching in with the receipt of a row address strobe (RAS), a given row address is presented on internal row address bus 206. After the row address is latched in, a column address received at the address port is latched in with a column address strobe (CAS) and presented on internal column address bus 207.

Row address bus 206 is coupled to a first input of a row address multiplexer 208 and the data load input of a counter 209. A second input of row multiplexer 208 is coupled to the output of row address counter 209. As will be discussed further below, row address counter loads an initial row address and increments therefrom in response to clock signal ROWINC to generate a sequence of row addresses. Each data bank 201 is associated with a row line (wordline) decoder 210. In the preferred embodiment, wordline decoder 210a selects for access a row in bank 201a in response to an even address output from row address multiplexer 208 and wordline decoder 210b selects for access a row in bank 201b in response to an odd address output from multiplexer 208.

Column address bus 207 is coupled to a first input of a column address multiplexer 211 and the data load input of a counter 212. As will be discussed below, column address counter 212 loads an initial address and increments therefrom in response to each falling edge of CAS (or alternatively a clock signal generated from CAS) to generate a sequence of column addresses. The output of column address multiplexer 211 is coupled to the column decoders/sense amplifier circuitry 213a and 213b associated with banks 201a and 201b respectively. In the preferred embodiment, both column decoders 213a and 213b respond to, each address output from column address multiplexer 211. Column address decoders/sense amplifiers 231 and column lines 204 provide the access paths to the selected cells in banks 201.

Input/output multiplexer 214 controls the exchange of data between control circuitry 205 and the column decoders/sense amplifiers 213a and 213b in response to the output from row address multiplexer 208. In the preferred embodiment, I/0 multiplexer 214 allows access to the addressed cells in bank 201a (through column decoder/sense amplifiers 213a) in response to even row addresses and access to the addressed cells in bank 201b in response to odd row addresses.

Row address multiplexer 208 and column address multiplexer 211 are switched in response to control signals by multiplexer control circuitry 215. A mode select signal received through control circuitry 205 determines whether memory 200 is operating in a conventional random access mode or in a page (burst) mode. In the random access mode, row address multiplexer 208 and column address multiplexer 211 always switched to pass addresses presented on row and column address buses 206 and 207 to row and column decoders 210 and 211. In the page mode, row address multiplexer 208 passes the initial row address presented on row address bus 206 and thereafter is switched by multiplexer control circuitry 215 such that the next row addresses of a given sequence of row addresses are passed from row counter 209 (the first address output from row counter 209 is the initial row address loaded therein incremented by one). Similarly, column address multiplexer 211 in the page mode passes an initial column address presented on column address bus 207 and is thereafter switched by multiplexer control circuitry 215 such that the following column addresses in a given sequence of column addresses are passed from column counter 212 (the first address output from column address counter 212 is the initial column address loaded therein incremented by one).

Multiplexer control circuitry 215 also receives row and column stop addresses from control circuitry 205 via bus 216. In the page mode, these stop addresses designate the address of the last row and the last column to be accessed. In the preferred embodiment, the row and column stop addresses are received in serial at the address input port following receipt of the initial row and column addresses. As discussed further below, the stop addresses are latched in (multiplexed) in response to CAS and a stop address strobe (SAS). Multiplexer control circuitry 215 compares the received row and column stop addresses with the respective current addresses being output from row counter 209 and column counter 212. When the count in column counter 212 equals the column stop address, the last cell along the address row has been addressed and upon the next falling edge of CAS after access to that cell is complete, ROWINC goes active to increment the row address in row counter 209. Completion of access to a given cell, such as the last cell in a row, may be determined by monitoring the latching of the corresponding data in either control circuitry 205 and/or I/O MUX 214. Column counter 212 then returns to the initial column address either by resetting or by wrapping-around. Row counter 209 increments with each active period of ROWINC until the count therein equals the row stop address latched into control circuitry 205. Once access to the cell in the last selected column and in the last selected row is complete i.e., the current counts in both counter 209 and 212 respectively equal the latched in row and column stop addresses and access to the correspondingly addressed cell 201 is complete) the entire burst access cycle is complete. Row and column address multiplexers 208 and 211 switch to await new initial addresses on buses 206 and 207.

The timing diagram of FIG. 2B illustrates the timing of selected cycles of a page access to memory 200. A row address to an initial row presented at the address port and latched in with the falling edge of RAS. After a delay interval the initial row address appears on the row address bus 206. Assuming for discussion purposes that the initial row address is even and therefore addresses an initial row in bank 201a (bank 0). An initial column address next received at the address port and latched in with the first falling edge of CAS. After a delay interval, the first column address appears on column address bus 207. On the two falling edges of CAS after SAS goes low, the row and column stop addresses are latched in through the address port.

The initial row and column addresses are coupled from buses 206 and 207 through multiplexers 208 and 211 to the row address decoders 210 and column address decoders 213. The initial row and column addresses are also loaded into row address counter 209 and column address counters 212 respectively. Since the initial address is even, the cell at the initially addressed row and column of Bank 0 (labeled Bank 0, Row X and Column Y in FIG. 2B) is accessed through I/O multiplexer 214 after a delay interval. During a read cycle, the bitlines in deselected bank 201b (bank 1) are pre-charged by column decoder/sense amplifier circuitry 213b while data is output from bank 0.

Column address counter 209 increments with each subsequent CAS until control circuitry 215 detects a match between the Count and the column stop address. The resulting sequence of addresses are passed through column address multiplexer 211 to allow access a sequence of cells along the initial row of bank 0.

As access to the cell corresponding to the last column address in the initial row in Bank 0 is occurring (Bank 0, Row X, Column Y+N), the next row address (the initial row address plus 1) is generated by incrementing the initial row address with in counter 209. The new address is passed to wordline decoders 210 through row address multiplexer 209. Column address counter 212 returns to its initial address. In the present example, the new row address is odd and wordline decoder 210b therefore responds to access a first row in bank 201b (bank 1). On the next falling edge of CAS, access to the initial column in the first row in bank 1 occurs (Bank 1, Row X+1, Column Y). A sequence of column addresses are again generated using counter 212 thereby allowing access of a sequence of cells along the first row of bank 1.

Access to a block of cells 201, consisting of all or a portion of the cells 201 of bank 0 and bank 1 is achieved, by continuing to increment the row and column addresses in counters 209 and 212 until both counts match the row stop and column addresses.

Figure 3A:
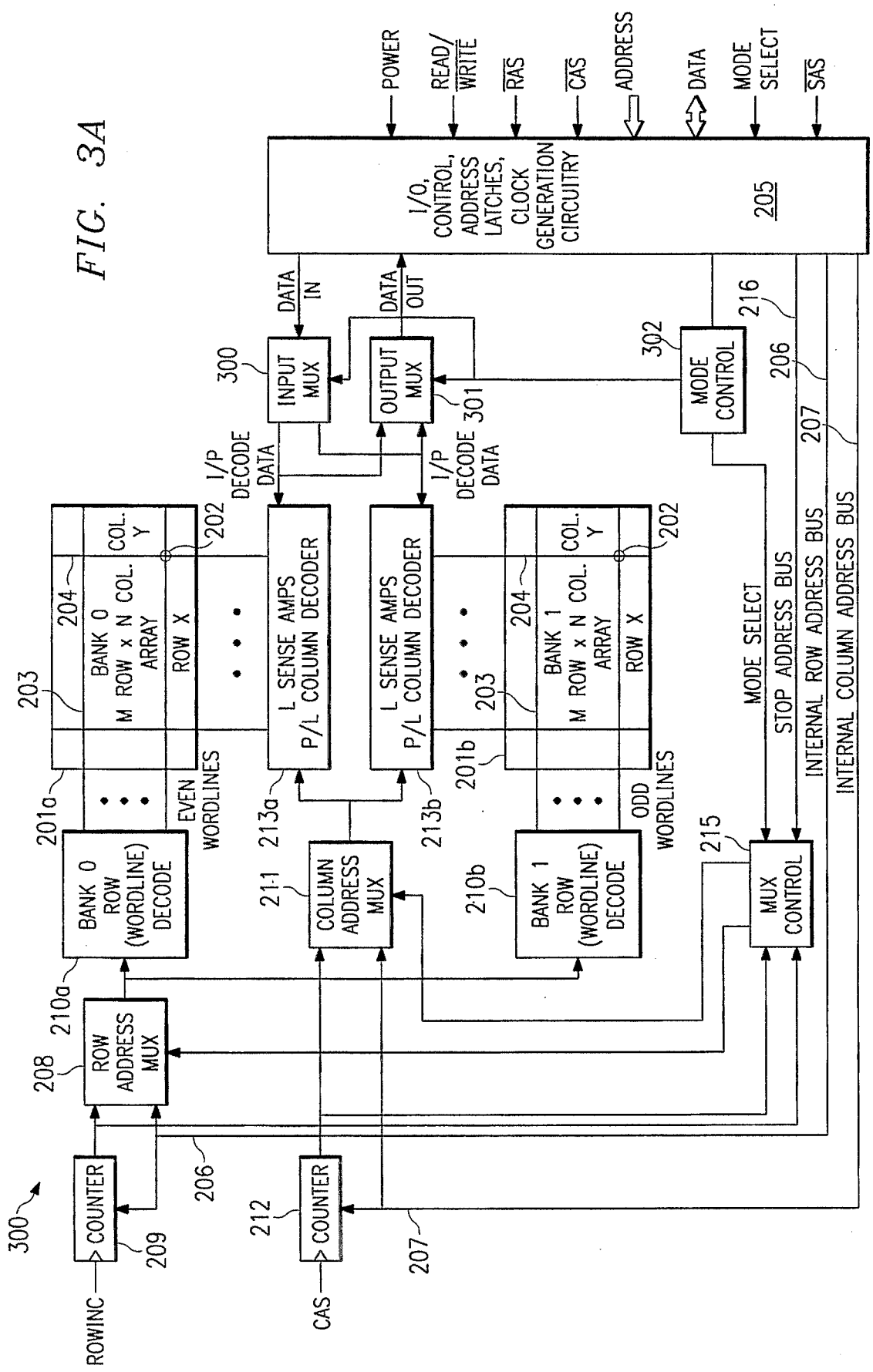
FIG. 3A is a functional block diagram of a second dual bank memory embodying the principles of the present invention.
Figure 3B:
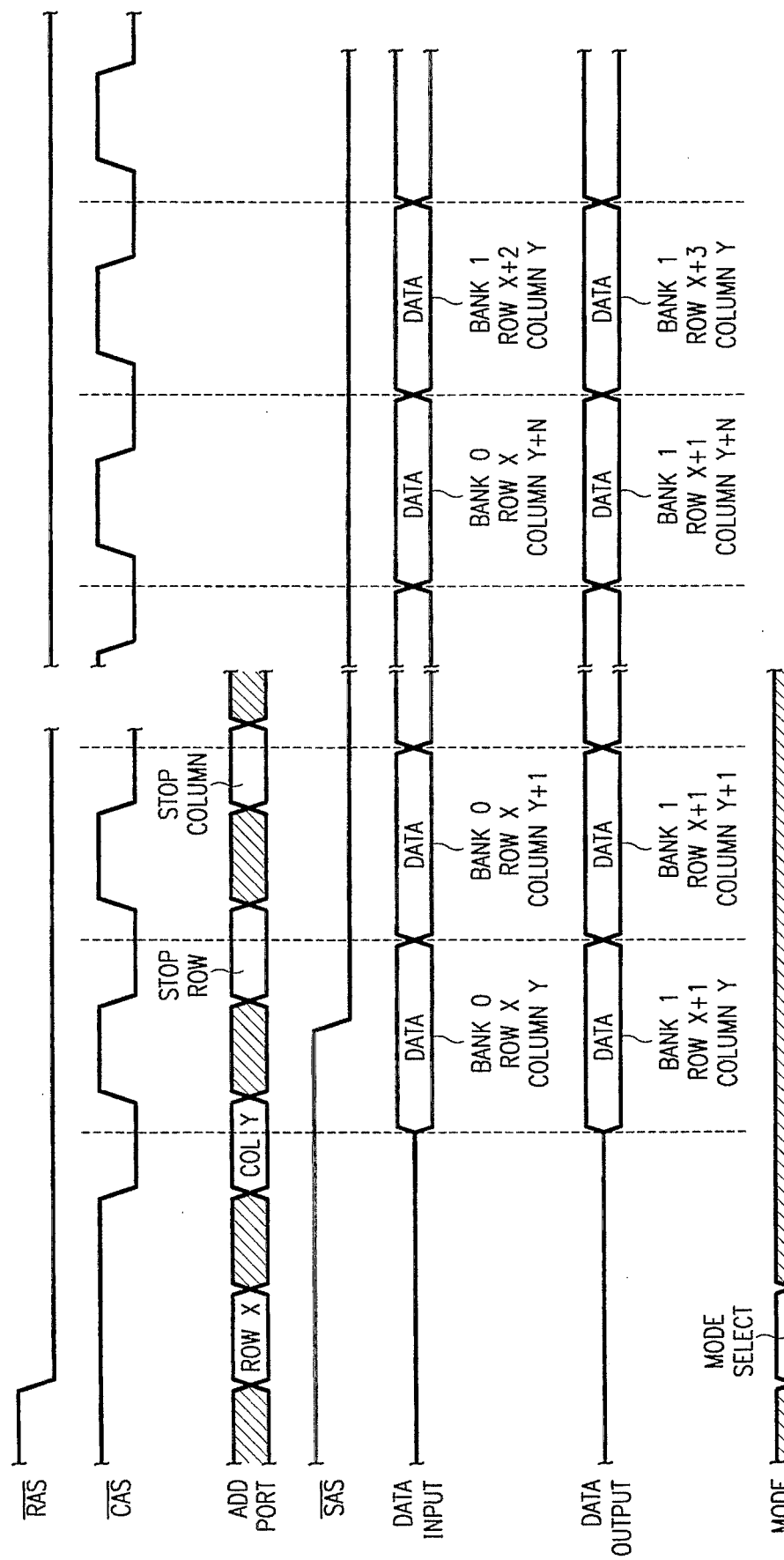
FIG. 3B is a timing diagram illustrating the timing relationship between selected signals during the operation of the memory of FIG. 3B.

FIG. 3A depicts a second memory 300 according to the principles of the present invention. In this case, the single I/O multiplexer 214 of memory 200 has been replaced with an input multiplexer 300 and an output multiplexer 301 which allows data to be read from one bank 201 while data is being written into the other bank 201. In this embodiment, the mode select signal is a multi-bit word or op code provided to mode control circuitry 302 which both controls the selection of random access/page mode operation and the selection of banks for read and write purposes. Simultaneous reading and writing to separate banks 201 may be performed in either a random access fashion or in a page mode access similar to that described above. The timing of selected signals of a page mode access for a mode in which data is being input to bank 201a (bank 0) and output from bank 201b (bank 1) is shown in FIG. 3B. Since row decoder 210 responds to even addresses and row decoder responds to odd addresses in the illustrated embodiment, the row addresses applied thereto are offset from one another by one such that both banks can be simultaneously accessed. In this case, row address counter 209 counts by two. In alternate embodiments, both row decoders 210a and 210b may be constructed to respond to every address and row address counter counts by one.

Although the present invention and its advantages have been described in detail, it should be understood that various changes, substitutions and alterations can be made herein without departing from the spirit and scope of the invention as defined by the appended claims.

What is claimed is:

1. Memory circuitry comprising:

first and second banks of memory cells arranged in rows and columns;

row decoder circuitry for selecting a said row in at least one of said banks in response to a row address, said row decoder circuitry comprising:
    a first row decoder for selecting a said row in said first bank in response to a row address from a first group of row addresses; and
    a second row decoder for selecting a said row in said second bank in response to a row address from a second group of row addresses;

row address circuitry for presenting a sequence of said row addresses to said row decoder circuitry in response to a single row address received at an address port to said memory circuitry;

column decoder circuitry for selecting a said column in each of said banks in response to a column address, said column decoder comprising:
    a first column decoder for selecting a said column in said first bank in response to each said column address; and
    a second column decoder for selecting a said column in said second bank in response to each said column address;

column address circuitry for presenting a sequence of said column addresses to said column decoder circuitry in response to a single column address received at said address port; and input/output circuitry for coupling a data input/output port of said memory circuitry with said first column decoder in response to row addresses of said first group from said row address circuitry and with said second column decoder in response to row addresses of said second group from said row address circuitry.

2. The memory of claim 1 wherein said input/output circuitry comprises:

input multiplexer circuitry for writing data to a selected one of said banks; and output multiplexer circuitry for reading data from a selected one of said banks.

3. The memory circuitry of claim 2 wherein said row decoder circuitry is operable to simultaneously provide row addresses to each of said banks such that data is written into a first one of said banks while data is read from a second one of said banks.

4. The memory of claim 1 wherein said memory cells comprise dynamic random access memory cells.

5. Memory circuitry comprising:

first and second banks of memory cells arranged in rows and columns;

row decoder circuitry for selecting a said row in at least one of said banks in response to a row address;

row decoder circuitry for presenting a sequence of said row addresses to said row decoder circuitry in response to a single row address received at an address port to said memory circuitry;

column decoder circuitry for selecting a said column in each of said banks in response to a column address; and column address circuitry for presenting a sequence of said column addresses to said column decoder circuitry in response to a single column address received at said address port, said column address circuitry comprising:
    a column address counter for generating a sequence of said column addresses per each said row address by incrementing from a first column address to a last column address in response to clock signal; and
    multiplexer circuitry for presenting to said column decoders an initial column address received from said address port and thereafter at least a first column address provided by said column address counter.

6. Memory circuitry comprising:

first and second banks of memory cells arranged in rows and columns;

row decoder circuitry for selecting a said row in at least one of said banks in response to a row address;

row address circuitry for presenting a sequence of said row addresses to said row decoder circuitry in response to a single row address received at an address port to said memory circuitry;

column decoder circuitry for selecting a said column in each of said banks in response to a column address;

column address circuitry for presenting a sequence of said column addresses to said column decoder circuitry in response to a single column address received at said address port; and wherein said row address circuitry comprises:

a row address counter for generating a sequence of said row addresses by incrementing from a first row address to a last row address following access to a said cell in a column corresponding to a said last column address; and multiplexer circuitry for presenting to said row decoder circuitry an initial row address received from said address port and thereafter at least a first row address provided by said row address counter.

7. Memory circuitry comprising:

first and second banks of memory cells arranged in rows and columns;

row decoder circuitry for selecting a said row in at least of one said banks in response to a row address;

row address circuitry for presenting a sequence of said row addresses to said row decoder circuitry in response to a single row address received at an address port to said memory circuitry, said row address circuitry including circuitry for offsetting a row address to said first bank to generate a row address to said second bank;

column decoder circuitry for selecting a said column in at least one of said banks in response to a column address;

column address circuitry for presenting a sequence of said column addresses to said column decoder circuitry in response to a single column address received at said address port;

input multiplexer circuitry for writing data to a selected one of said banks; and output multiplexer circuitry for reading data from a selected one of said banks.

8. The memory circuitry of claim 7 wherein said row decoder circuitry is operable to generate addresses for simultaneously accessing cells along rows in both said first and second banks.

9. The memory circuitry of claim 8 wherein said input and output multiplexers allow a write to a first selected one of said banks and substantially simultaneously therewith a read from a second selected one of said banks.

10. The memory circuitry of claim 7 and further comprising mode control circuitry for switching said input and output multiplexers in response to a received op code.

11. The memory circuitry of claim 10 wherein said mode control circuitry is further operable to select an access type to be made to a selected one of said first and second banks.

12. The memory circuitry of claim 11 wherein said access type is selected from the group consisting of random and page mode accesses.

13. A method of accessing data in a memory system including first and second banks of memory cells arranged in rows and columns, a first row decoder for selecting a row in the first bank in response to a row address from a first group of row addresses, a second row decoder for selecting a row in the second bank in response to a row address from a second group of row addresses, and column decoder circuitry for selecting ones of the columns for access, the method comprising the steps of:

generating an address from the first group and an address from the second group for presentation to the first and second row decoders for substantially simultaneously accessing a row in the first bank and a row in the second bank, said step of generating comprising the substeps of generating a row address in the first group to access the first bank and offsetting the address in the first group to generate a row address in the second group the access the second bank;

presenting a sequence of addresses to the column decoder circuitry for accessing a sequence of locations in the selected rows of the first and second banks;

writing data to the sequence of locations in the accessed row of the first bank through an input multiplexer; and reading data from the sequence of locations in the accessed row of the second bank through an output multiplexer.

14. The method of claim 13 and further comprising the step of generating a second address from the first group and a second address from the second group for accessing a second row in the first bank and substantially simultaneously a second row in the second bank.

15. The method of claim 13 wherein said step of generating comprises the step of generating addresses by incrementing a counter.

16. The method of claims 15 wherein the counter is incremented by two.

* * * * *